US007012354B2

(12) United States Patent
Wong

(10) Patent No.: US 7,012,354 B2
(45) Date of Patent: Mar. 14, 2006

(54) METHOD AND STRUCTURE FOR A PUSHER-MODE PIEZOELECTRICALLY ACTUATED LIQUID METAL SWITCH

(75) Inventor: Marvin Glenn Wong, Woodland Park, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 143 days.

(21) Appl. No.: 10/413,098

(22) Filed: Apr. 14, 2003

(65) Prior Publication Data

US 2004/0201317 A1 Oct. 14, 2004

(51) Int. Cl.
*H01L 41/08* (2006.01)
*H01H 29/02* (2006.01)
*H01H 57/00* (2006.01)

(52) U.S. Cl. ...................... 310/328; 310/348; 200/182; 200/214; 200/219; 335/47; 335/49; 335/51; 335/58

(58) Field of Classification Search ................ 310/328, 310/348; 200/182, 214, 215, 219; 335/47, 335/49, 51, 58
See application file for complete search history.

(56) References Cited

U.S. PATENT DOCUMENTS 2,312,672 A 3/1943 Pollard, Jr. .................. 335/58
2,564,081 A 8/1951 Schilling ..................... 335/56
3,430,020 A 2/1969 Tomkewitsch et al. ..... 200/181
3,529,268 A 9/1970 Rauterberg .................. 335/56
3,600,537 A 8/1971 Twyford ...................... 200/407
3,639,165 A 2/1972 Rairden, III ................ 428/433
3,657,647 A 4/1972 Beusman et al. ............. 324/94
4,103,135 A 7/1978 Gomez et al. .............. 200/185
4,200,779 A * 4/1980 Zakurdaev et al. ......... 200/187
4,238,748 A 12/1980 Goullin et al. ................ 335/56
4,245,886 A 1/1981 Kolodzey et al. ............. 385/19
4,336,570 A 6/1982 Brower .......................... 362/4
4,419,650 A 12/1983 John .......................... 337/119
4,434,337 A 2/1984 Becker ....................... 200/220
4,475,033 A 10/1984 Willemsen et al. ...... 250/201.1
4,505,539 A 3/1985 Auracher et al. ............. 385/19
4,582,391 A 4/1986 Legrand ...................... 385/17
4,628,161 A 12/1986 Thackrey ................. 200/61.47

(Continued)

FOREIGN PATENT DOCUMENTS

EP 0593836 A1 10/1992

(Continued)

OTHER PUBLICATIONS

Jonathan Simon, "A Liquid-Filled Microrelay With A Moving Mercury Microdrop" (Sep. 1997) Journal of Microelectromechanical Systems, vol. 6, No. 3, PP 208-216.

(Continued)

*Primary Examiner*—Thomas M. Dougherty

(57) ABSTRACT

A method and structure for an electrical switch. According to the structure of the present invention, a liquid-filled chamber is housed within a solid material. A plurality of switch contacts within the liquid-filled chamber are coupled to the solid material, while a plurality of piezoelectric elements are coupled to a plurality of membranes. The plurality of membranes are coupled to the liquid-filled chamber. The plurality of switch contacts are coupled to a plurality of liquid metal globules. According to the method, a piezoelectric element is actuated, causing a membrane element to be deflected. The deflection of the membrane element increases pressure of actuator liquid and the increase in pressure of the actuator liquid breaks a liquid metal connection between a first contact and a second contact of the electrical switch.

25 Claims, 4 Drawing Sheets

U.S. PATENT DOCUMENTS

| | | | | |
|---|---|---|---|---|
| 4,652,710 | A | 3/1987 | Karnowsky et al. | 200/235 |
| 4,657,339 | A | 4/1987 | Fick | 385/22 |
| 4,742,263 | A | 5/1988 | Harnden, Jr. et al. | 310/331 |
| 4,786,130 | A | 11/1988 | Georgiou et al. | 385/48 |
| 4,797,519 | A | 1/1989 | Elenbaas | 200/226 |
| 4,804,932 | A | 2/1989 | Akanuma et al. | 335/38 |
| 4,988,157 | A | 1/1991 | Jackel et al. | 385/17 |
| 5,278,012 | A | 1/1994 | Yamanaka et al. | 430/32 |
| 5,415,026 | A | 5/1995 | Ford | 73/651 |
| 5,502,781 | A | 3/1996 | Li et al. | 385/4 |
| 5,644,676 | A | 7/1997 | Blomberg et al. | 370/416 |
| 5,675,310 | A | 10/1997 | Wojnarowski et al. | 338/309 |
| 5,677,823 | A | 10/1997 | Smith | 361/234 |
| 5,751,074 | A | 5/1998 | Prior et al. | 307/118 |
| 5,751,552 | A | 5/1998 | Scanlan et al. | 361/707 |
| 5,828,799 | A | 10/1998 | Donald | 385/16 |
| 5,841,686 | A | 11/1998 | Chu et al. | 365/51 |
| 5,849,623 | A | 12/1998 | Wojnarowski et al. | 438/382 |
| 5,874,770 | A | 2/1999 | Saia et al. | 257/536 |
| 5,875,531 | A | 3/1999 | Nellissen et al. | 29/25.35 |
| 5,886,407 | A | 3/1999 | Polese et al. | 257/706 |
| 5,889,325 | A | 3/1999 | Uchida et al. | 257/724 |
| 5,912,606 | A | 6/1999 | Nathanson et al. | 335/47 |
| 5,915,050 | A | 6/1999 | Russell et al. | 385/7 |
| 5,972,737 | A | 10/1999 | Polese et al. | 438/122 |
| 5,994,750 | A | 11/1999 | Yagi | 257/415 |
| 6,021,048 | A | 2/2000 | Smith | 361/236 |
| 6,180,873 | B1 | 1/2001 | Bitko | 174/9 F |
| 6,201,682 | B1 | 3/2001 | Mooij et al. | 361/306.1 |
| 6,207,234 | B1 | 3/2001 | Jiang | 427/333 |
| 6,212,308 | B1 | 4/2001 | Donald | 385/16 |
| 6,225,133 | B1 | 5/2001 | Yamamichi et al. | 438/3 |
| 6,278,541 | B1 | 8/2001 | Baker | 359/291 |
| 6,304,450 | B1 | 10/2001 | Dibene, II et al. | 361/704 |
| 6,320,994 | B1 | 11/2001 | Donald et al. | 385/16 |
| 6,323,447 | B1 | 11/2001 | Kondoh | 200/182 |
| 6,351,579 | B1 | 2/2002 | Early et al. | 385/18 |
| 6,356,679 | B1 | 3/2002 | Kapany | 385/18 |
| 6,373,356 | B1 | 4/2002 | Gutierrez | 335/47 |
| 6,396,012 | B1 | 5/2002 | Bloomfield | 200/238 |
| 6,396,371 | B1 | 5/2002 | Streeter et al. | 335/28 |
| 6,408,112 | B1 | 6/2002 | Bartels | 385/16 |
| 6,446,317 | B1 | 9/2002 | Figueroa et al. | 29/25.42 |
| 6,453,086 | B1 | 9/2002 | Tarazona | 385/20 |
| 6,470,106 | B1 | 10/2002 | McClelland et al. | 385/16 |
| 6,487,333 | B1 | 11/2002 | Fouquet | 385/18 |
| 6,501,354 | B1 | 12/2002 | Gutierrez et al. | 335/47 |
| 6,512,322 | B1 | 1/2003 | Wong | 310/328 |
| 6,515,404 | B1 | 2/2003 | Wong | 310/328 |
| 6,516,504 | B1 | 2/2003 | Schaper | 29/25.42 |
| 6,559,420 | B1 | 5/2003 | Zarev | 219/209 |
| 6,633,213 | B1 | 10/2003 | Dove | 335/78 |
| 6,768,068 | B1 * | 7/2004 | Wong et al. | 200/182 |
| 2001/0048353 | A1 * | 12/2001 | Streeter et al. | 335/78 |
| 2002/0037128 | A1 | 3/2002 | Burger et al. | 385/16 |
| 2002/0146197 | A1 | 10/2002 | Yong | 385/17 |
| 2002/0150323 | A1 | 10/2002 | Nishida et al. | 385/16 |
| 2002/0168133 | A1 | 11/2002 | Saito | 385/16 |
| 2003/0035611 | A1 | 2/2003 | Shi | 385/16 |
| 2004/0037708 | A1 * | 2/2004 | Murasato et al. | 417/99 |
| 2004/0076531 | A1 * | 4/2004 | Takeuchi et al. | 417/322 |
| 2004/0201317 | A1 * | 10/2004 | Wong | 310/328 |
| 2004/0201330 | A1 * | 10/2004 | Fong et al. | 310/365 |
| 2004/0202558 | A1 * | 10/2004 | Fong et al. | 417/413.2 |

FOREIGN PATENT DOCUMENTS

| | | | |
|---|---|---|---|
| FR | 2418539 | A | 9/1979 |
| FR | 2458138 | A1 | 10/1980 |
| FR | 2667396 | | 9/1990 |
| GB | 2005473 | A | 9/1978 |
| GB | 2385989 | A | 2/2003 |
| JP | 36-18575 | | 10/1961 |
| JP | 47-21645 | | 10/1972 |
| JP | 63-276838 | | 5/1987 |
| JP | 01-294317 | | 5/1988 |
| JP | 08-125487 | A | 5/1996 |
| JP | 9161640 | A | 6/1997 |
| WO | WO 99/46624 | A1 | 9/1999 |

OTHER PUBLICATIONS

Marvin Glenn Wong, "A Piezoelectrically Actuated Liquid Metal Switch", May 2, 2002, patent application (pending), 12 pages of specification, 5 pages of claims, 1 page of abstract, and 10 sheets of drawings (Fig. 1-10).

Bhedwar, Homi C. et al. "Ceramic Multilayer Package Fabrication," Electronic Materials Handbook, Nov. 1989, pp. 460-469, vol. 1 Packaging, Section 4: Packages.

"Integral Power Resistors for Aluminum Substrate, " IBM Technical Disclosure Bulletin, Jun. 1984, US, Jun. 1, 1984, p. 827, vol. 27 , No. 1B, TDB-ACC-NO: NB8406827, Cross Reference: 0018-8689-27-1B-827.

Kim, Joonwon et al. "A Micromechanical Switch with Electrostatically Driven Liquid-Metal Droplet." Sensors and Actuators, A: Physical, v 9798, Apr. 1, 2002, 4 pages.

* cited by examiner

METHOD AND STRUCTURE FOR A PUSHER-MODE PIEZOELECTRICALLY ACTUATED LIQUID METAL SWITCH

CROSS REFERENCE TO RELATED APPLICATIONS

This application is related to the following co-pending U.S. patent applications, being identified by the below enumerated identifiers and arranged in alphanumerical order, which have the same ownership as the present application and to that extent are related to the present application and which are hereby incorporated by reference:

Application 10010448-1, titled "Piezoelectrically Actuated Liquid Metal Switch", filed May 2, 2002 and identified by Ser. No. 10/137,691;

Application 10010529-1, "Bending Mode Latching Relay", and having the same filing date as the present application;

Application 10010531-1, "High Frequency Bending Mode Latching Relay", and having the same filing date as the present application;

Application 10010570-1, titled "Piezoelectrically Actuated Liquid Metal Switch", filed May 2, 2002 and identified by Ser. No. 10/142,076;

Application 10010571-1, "High-frequency, Liquid Metal, Latching Relay with Face Contact", and having the same filing date as the present application;

Application 10010572-1, "Liquid Metal, Latching Relay with Face Contact", and having the same filing date as the present application;

Application 10010573-1, "Insertion Type Liquid Metal Latching Relay", and having the same filing date as the present application;

Application 10010617-1, "High-frequency, Liquid Metal, Latching Relay Array", and having the same filing date as the present application;

Application 10010618-1, "Insertion Type Liquid Metal Latching Relay Array", and having the same filing date as the present application;

Application 10010634-1, "Liquid Metal Optical Relay", and having the same filing date as the present application;

Application 10010640-1, titled "A Longitudinal Piezoelectric Optical Latching Relay", filed Oct. 31, 2001 and identified by Ser. No. 09/999,590;

Application 10010643-1, "Shear Mode Liquid Metal Switch", and having the same filing date as the present application;

Application 10010644-1, "Bending Mode Liquid Metal Switch", and having the same filing date as the present application;

Application 10010656-1, titled "A Longitudinal Mode Optical Latching Relay", and having the same filing date as the present application;

Application 10010664-1, "Method and Structure for a Pusher-Mode Piezoelectrically Actuated Liquid Metal Optical Switch", and having the same filing date as the present application;

Application 10010790-1, titled "Switch and Production Thereof", filed Dec. 12, 2002 and identified by Ser. No. 10/317,597;

Application 10011055-1, "High Frequency- Latching Relay with Bending Switch Bar", and having the same filing date as the present application;

Application 10011056-1, "Latching Relay with Switch Bar", and having the same filing date as the present application;

Application 10011064-1, "High Frequency Push-mode Latching Relay", and having the same filing date as the present application;

Application 10011065-1, "Push-mode Latching Relay", and having the same filing date as the present application;

Application 10011121-1, "Closed Loop Piezoelectric Pump", and having the same filing date as the present application;

Application 10011329-1, titled "Solid Slug Longitudinal Piezoelectric Latching Relay", filed May 2, 2002 and identified by Ser. No. 10/137,692;

Application 10011344-1, "Method and Structure for a Slug Pusher-Mode Piezoelectrically Actuated Liquid Metal Switch", and having the same filing date as the present application;

Application 10011345-1, "Method and Structure for a Slug Assisted Longitudinal Piezoelectrically Actuated Liquid Metal Optical Switch", and having the same filing date as the present application;

Application 10011397-1, "Method and Structure for a Slug Assisted Pusher-Mode Piezoelectrically Actuated Liquid Metal Optical Switch", and having the same filing date as the present application;

Application 10011398-1, "Polymeric Liquid Metal Switch", and having the same filing date as the present application;

Application 10011410-1, "Polymeric Liquid Metal Optical Switch", and having the same filing date as the present application;

Application 10011436-1, "Longitudinal Electromagnetic Latching Optical Relay", and having the same filing date as the present application;

Application 10011437-1, "Longitudinal Electromagnetic Latching Relay", and having the same filing date as the present application;

Application 10011458-1, "Damped Longitudinal Mode Optical Latching Relay", and having the same filing date as the present application;

Application 10011459-1, "Damped Longitudinal Mode Latching Relay", and having the same filing date as the present application;

Application 10020013-1, titled "Switch and Method for Producing the Same", filed Dec. 12, 2002 and identified by Ser. No. 10/317,963;

Application 10020027-1, titled "Piezoelectric Optical Relay", filed Mar. 28, 2002 and identified by Ser. No. 10/109,309;

Application 10020071-1, titled "Electrically Isolated Liquid Metal Micro-Switches for Integrally Shielded Microcircuits", filed Oct. 8, 2002 and identified by Ser. No. 10/266,872;

Application 10020073-1, titled "Piezoelectric Optical Demultiplexing Switch", filed Apr. 10, 2002 and identified by Ser. No. 10/119,503;

Application 10020162-1, titled "Volume Adjustment Apparatus and Method for Use", filed Dec. 12, 2002 and identified by Ser. No. 10/317,293;

Application 10020241-1, "Method and Apparatus for Maintaining a Liquid Metal Switch in a Ready-to-Switch Condition", and having the same filing date as the present application;

Application 10020242-1, titled "A Longitudinal Mode Solid Slug Optical Latching Relay", and having the same filing date as the present application;

Application 10020473-1, titled "Reflecting Wedge Optical Wavelength Multiplexer/Demultiplexer", and having the same filing date as the present application;

Application 10020540-1, "Method and Structure for a Solid Slug Caterpillar Piezoelectric Relay", and having the same filing date as the present application;

Application 10020541-1, titled "Method and Structure for a Solid Slug Caterpillar Piezoelectric Optical Relay", and having the same filing date as the present application;

Application 10030438-1, "Inserting-finger Liquid Metal Relay", and having the same filing date as the present application;

Application 10030440-1, "Wetting Finger Liquid Metal Latching Relay", and having the same filing date as the present application;

Application 10030521-1, "Pressure Actuated Optical Latching Relay", and having the same filing date as the present application;

Application 10030522-1, "Pressure Actuated Solid Slug Optical Latching Relay", and having the same filing date as the present application; and Application 10030546-1, "Method and Structure for a Slug Caterpillar Piezoelectric Reflective Optical Relay", and having the same filing date as the present application.

TECHNICAL FIELD

This invention relates generally to the field of electronic devices and systems, and more specifically to electronic switching technology.

BACKGROUND

A relay or switch may be used to change an electrical signal from a first state to a second state. In general there may be more than two states. In applications that require a small switch geometry or a large number of switches within a small region, microelectronic fabrication techniques may be used to create switches with a small footprint. A semiconductor switch may be used in a variety of applications, such as industrial equipment, telecommunications equipment and control of electromechanical devices such as ink jet printers.

In switching applications, the use of piezoelectric technology may be used to actuate a switch. Piezoelectric materials have several unique characteristics. A piezoelectric material can be made to expand or contract in response to an applied voltage. This is known as the indirect piezoelectric effect. The amount of expansion or contraction, the force generated by the expansion or contraction, and the amount of time between successive contractions are important material properties that influence the application of a piezoelectric material in a particular application. Piezoelectric material also exhibits a direct piezoelectric effect, in which an electric field is generated in response to an applied force. This electric field may be converted to a voltage if contacts are properly coupled to the piezoelectric material. The indirect piezoelectric effect is useful in making or breaking a contact within a switching element, while the direct piezoelectric effect is useful in generating a switching signal in response to an applied force.

SUMMARY

A method and structure for an electrical switch is disclosed. According to the structure of the present invention, a liquid-filled chamber is housed within a solid material. Switch contacts within the liquid-filled chamber are coupled to the solid material, while piezoelectric elements are coupled to a plurality of membranes. The plurality of membranes are coupled to the liquid-filled chamber. The plurality of switch contacts are coupled to a plurality of liquid metal globules. According to the method of the present invention, a piezoelectric element is actuated, causing a membrane element to be deflected. The deflection of the membrane element increases pressure of actuator liquid and the increase in pressure of the actuator liquid breaks a liquid metal connection between a first contact and a second contact of the electrical switch.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION

Figure 1:
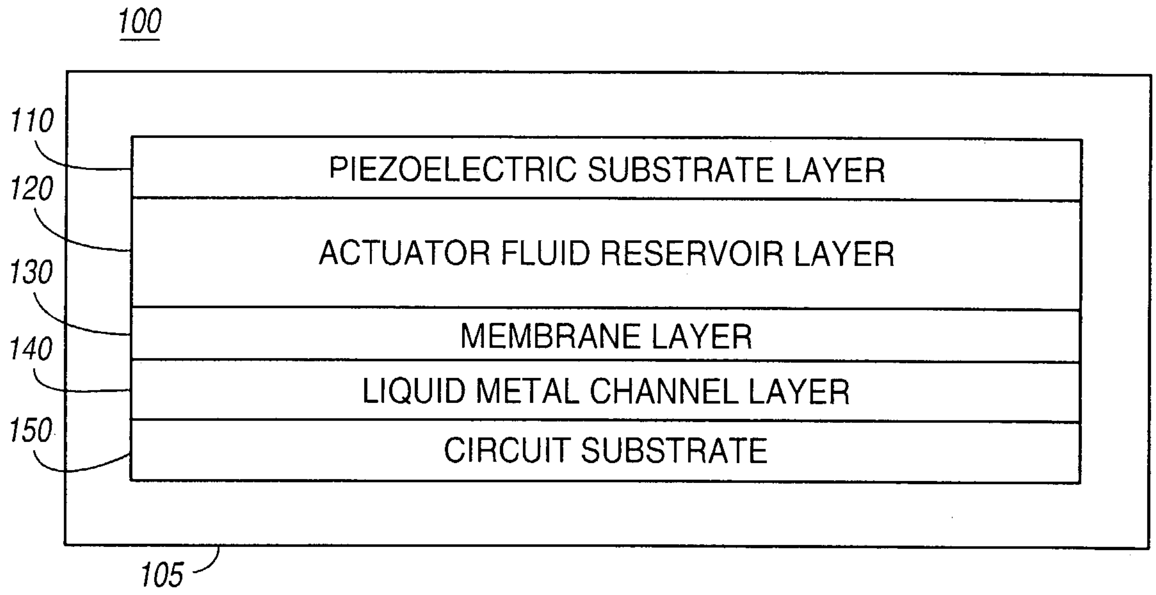
FIG. 1 is a side view of a pusher mode liquid metal switch, according to certain embodiments of the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

A liquid metal switch may be represented using a plurality of layers, wherein the plurality of layers represent layers created during a fabrication of the liquid metal switch.

Referring now to FIG. 1 a side view 100 of a pusher mode liquid metal switch 105 is shown, according to certain embodiments of the present invention. The pusher mode liquid metal switch 105 may be composed of a plurality of distinct layers, wherein the plurality of layers provide a plurality of functions. A piezoelectric substrate layer 110 is coupled to an actuator fluid reservoir layer 120. The actuator fluid reservoir layer 120 is coupled to membrane layer 130, while membrane layer 130 is coupled to liquid metal channel layer 140. Liquid metal channel layer 140 is further coupled to circuit substrate layer 150. It is noted that circuit substrate layer 150 may further comprise a plurality of circuit traces, wherein the plurality of circuit traces are not shown in FIG. 1. It is noted that one or more of the layers shown in FIG. 1 could be combined for otherwise named without departing from the spirit and scope of the present invention. As an example, membrane layer 130 and liquid metal channel layer 140 could be further combined into a channel layer, wherein the channel layer comprises a membrane and a channel. It is also noted that one or more additional layers could be present without departing from the spirit and scope of the present invention. In certain embodiments of the present invention, the piezoelectric substrate layer 110, actuator fluid reservoir layer 120, membrane layer 130, liquid metal channel layer 140, and circuit substrate layer 150 may be composed of one or more of glass, ceramic, composite material and ceramic-coated material.

Figure 2:
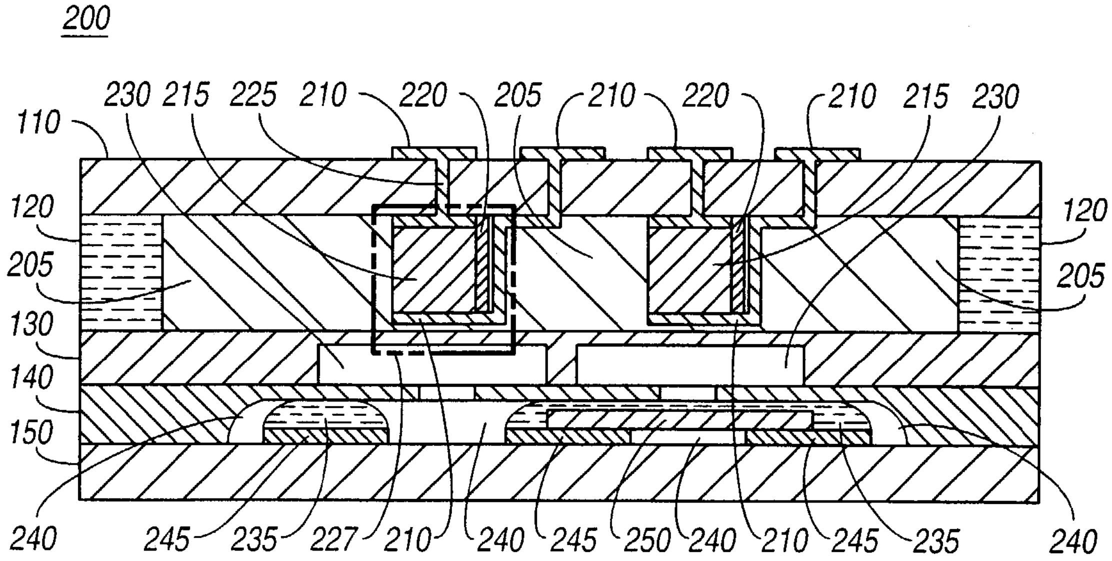
FIG. 2 is a cross sectional drawing of a pusher mode liquid metal switch, according certain embodiments of the present invention.

Referring now to FIG. 2 a cross-sectional drawing 200 of pusher mode liquid metal switch 105 is shown, according to certain embodiments of the present invention. Cross-sectional drawing 200 illustrates piezoelectric substrate layer 110 coupled to a plurality of contacts 210, wherein the plurality of contacts 210 are coupled to a plurality of vias 225. Plurality of vias 225 allow an electrical potential to be applied to a corresponding plurality of piezoelectric elements 215. The electrical potential may be applied using two contacts of the plurality of contacts 210. The two contacts are insulated by the use of a dielectric of plurality of dielectrics 220. The dielectric of the plurality of dielectrics 220 is coupled to each pair of contacts of the plurality of contacts 210, as illustrated in FIG. 2. In certain embodiments of the present invention, the plurality of dielectrics 220, plurality of piezoelectric elements 215, and a segment of each contact of the plurality of contacts 210 are located in actuator fluid reservoir layer 120. In certain embodiments of the present invention, pusher element 227 is comprised of a piezoelectric element of the plurality of piezoelectric elements 215, a dielectric of the plurality of dielectrics 220, and a segment of a contact of the plurality of contacts 210.

Pusher element 227 resides in the actuator fluid reservoir layer 120. Pusher element 227 is separated from an adjacent pusher element by the use of actuating fluid 205. In certain embodiments of the present invention, each pusher element in actuator fluid reservoir layer 120 is separated by actuating fluid 205. In certain embodiments of the present invention, actuating fluid 205 is composed of an inert, low viscosity, high-boiling fluid such as 3M Fluorinert. A forward electric potential is operable to elongate a piezoelectric element of the plurality of piezoelectric elements 215, while a reverse electric potential is operable to shorten a piezoelectric element of the plurality of piezoelectric elements 215. It is noted that a forward electric potential could be used to shorten a piezoelectric element, while a reverse electric potential could be used to elongate a piezoelectric element without departing from the spirit and scope of the present invention. Pusher element 227 is coupled to membrane layer 130 as shown in FIG. 2, so that an elongation of pusher element 227 pushes on membrane layer 130 thereby causing switching fluid 230 to expand from the membrane layer 130 into a channel 240 of the liquid metal channel layer 140.

Channel 240 comprises plurality of liquid metal 235, plurality of switch contacts 245, and switching fluid 230. The liquid metal 235, such as mercury or a Gallium alloy, acts as a friction-reducing lubricant. The plurality of liquid metal 235 are coupled to plurality of switch contacts 245, and one of the plurality of liquid metal 235 is coupled to two of the plurality of switch contacts 245. The plurality of switch contacts 245 are further coupled to circuit substrate layer 150.

Pusher mode liquid metal switch 105 operates by means of an applied electric potential to two contacts of the plurality of contacts 210. The applied electric potential causes a piezoelectric element of the plurality of piezoelectric elements to elongate. This elongation increases a pressure of switching fluid 230. Switching fluid 230 is then forced into chamber 240. A corresponding increase of a pressure of switching fluid 230 in chamber 240 causes a liquid metal, currently coupled to a first switch contact and a second switch contact of the plurality of switch contacts 245, of the plurality of liquid metal 235 to separate into two distinct regions where a first region is coupled to the first switch contact of the plurality of switch contacts 245 and a second region is coupled to the second switch contact of the plurality of switch contacts 245. In certain embodiments of the present invention, the liquid metal separates so that the second region is coupled to the second switch contact and a third switch contact of the plurality of switch contacts 245. The separation of the liquid metal of the plurality of liquid metal 235 is operable to change a value of the pusher mode liquid metal switch 105 from a first state to a second state. It is noted in certain embodiments of the present invention, the separation of the liquid metal is operable to be used to change a state of pusher mode liquid metal switch 105 without the use of the third switch contact. The liquid metal is maintained in a coupling to the second switch contact and the third switch contact by a surface tension between the liquid metal and a corresponding surfaces of the second switch contact and the third switch contact.

It is also noted that two pusher elements could be used so that a first pusher element separates a liquid metal of the plurality of liquid metal 235 coupled to the first switch contact and the second switch contact and a liquid metal is then coupled to the second switch contact and the third switch contact. A second pusher element could then be used to separate the liquid metal coupled to the second switch contact and the third switch contact. In certain embodiments of the present invention, the first pusher element could be made to push (elongate), while the second pusher element could be made to pull (shorten) so that the liquid metal is pushed by the first pusher element while the second pusher element creates a negative pressure to pull the liquid metal apart.

Figure 3:
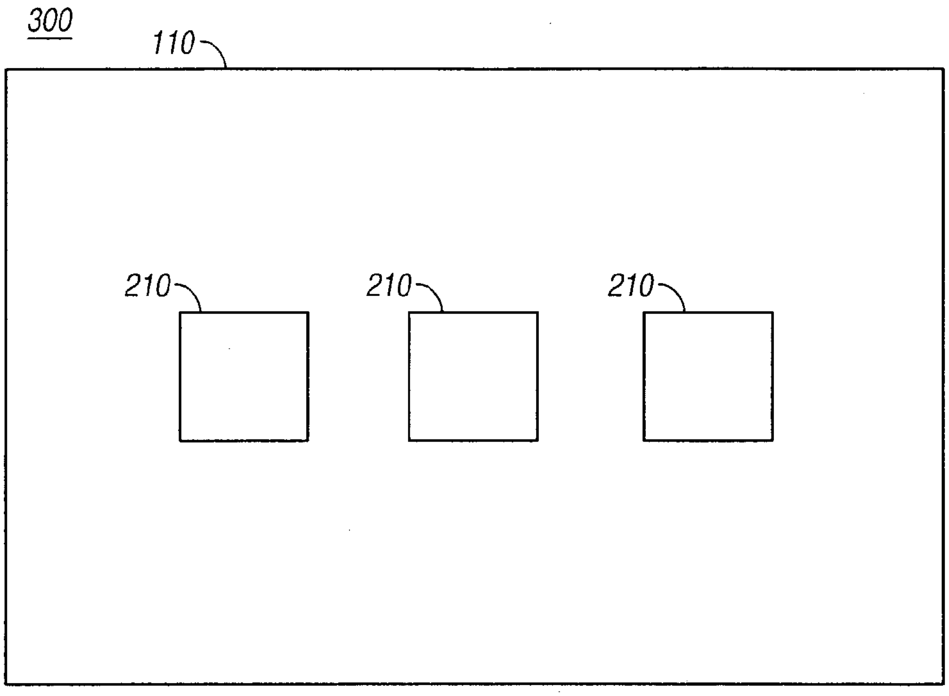
FIG. 3 is a top view of a circuit substrate layer of a pusher mode liquid metal switch, according to certain embodiments of the present invention.

Referring now to FIG. 3 a first top view 300 of the circuit substrate layer 110 of the pusher mode liquid metal switch 105 is shown, according to certain embodiments of the present invention. The first top view 300 illustrates the arrangement of the plurality of contacts 210. Although plurality of contacts 210 are represented as having a square top profile, other profiles, such as circular, could be used without departing from the spirit and scope of the present invention.

Figure 4:
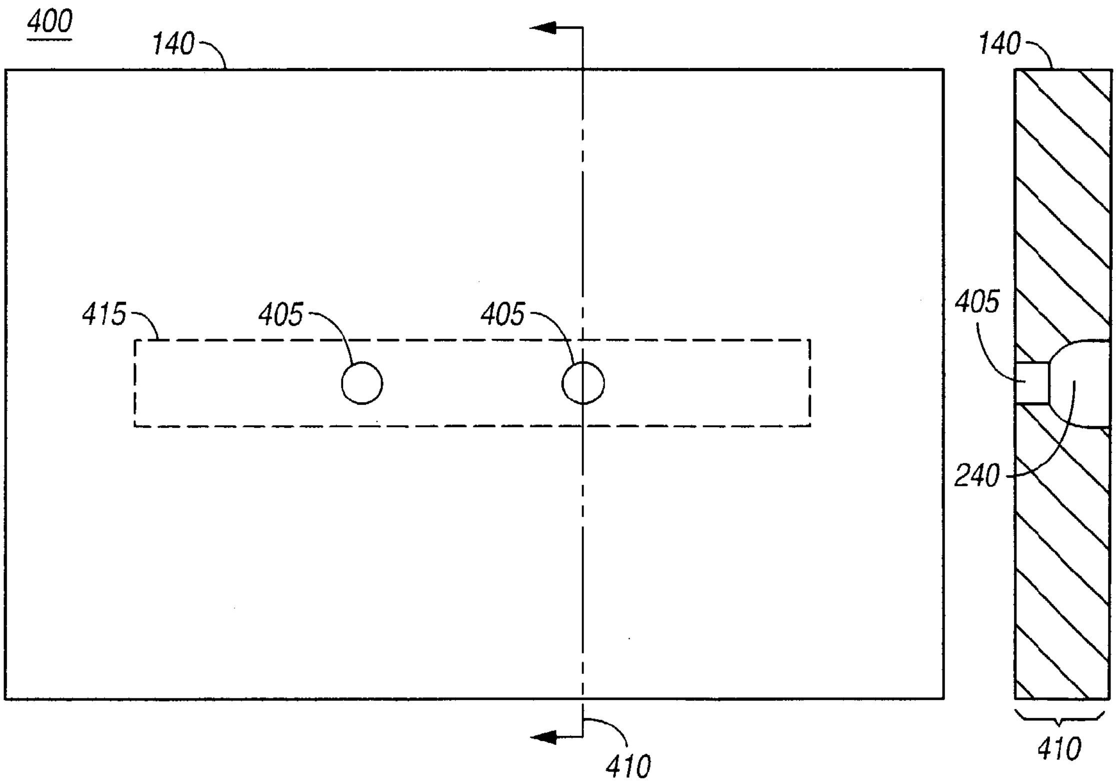
FIG. 4 is a top view of a liquid metal channel layer of a pusher mode liquid metal switch, according to certain embodiments of the present invention.

Referring now to FIG. 4 a top view 400 of the liquid metal channel layer 140 of the pusher mode liquid metal switch 105 is shown, according to certain embodiments of the present invention. The top view 400 illustrates a top view 415 of channel 240 showing a plurality of through holes 405, wherein plurality of through holes 405 are operable to enable switching fluid 230 to pass more forcefully into channel 240. Plurality of through holes 405 are sized so that a pressure of switching fluid 230 is increased, thereby enhancing a separation of a liquid metal of the plurality of liquid metals 235. A sectional view 410 of liquid metal channel layer 140 is also shown. The sectional view 410 illustrates a width of plurality of through holes 405 relative to a width of channel 240. It is noted that although two through holes are shown in FIG. 4, a greater number of through holes could be used without departing from the spirit and scope of the present invention. It is also noted that the plurality of through holes 405 are operable to have a plurality of distinct widths. The plurality of distinct widths may be chosen to match an amount of switching fluid 230 and an amount of elongation or shortening of plurality of piezoelectric elements 215.

Figure 5:
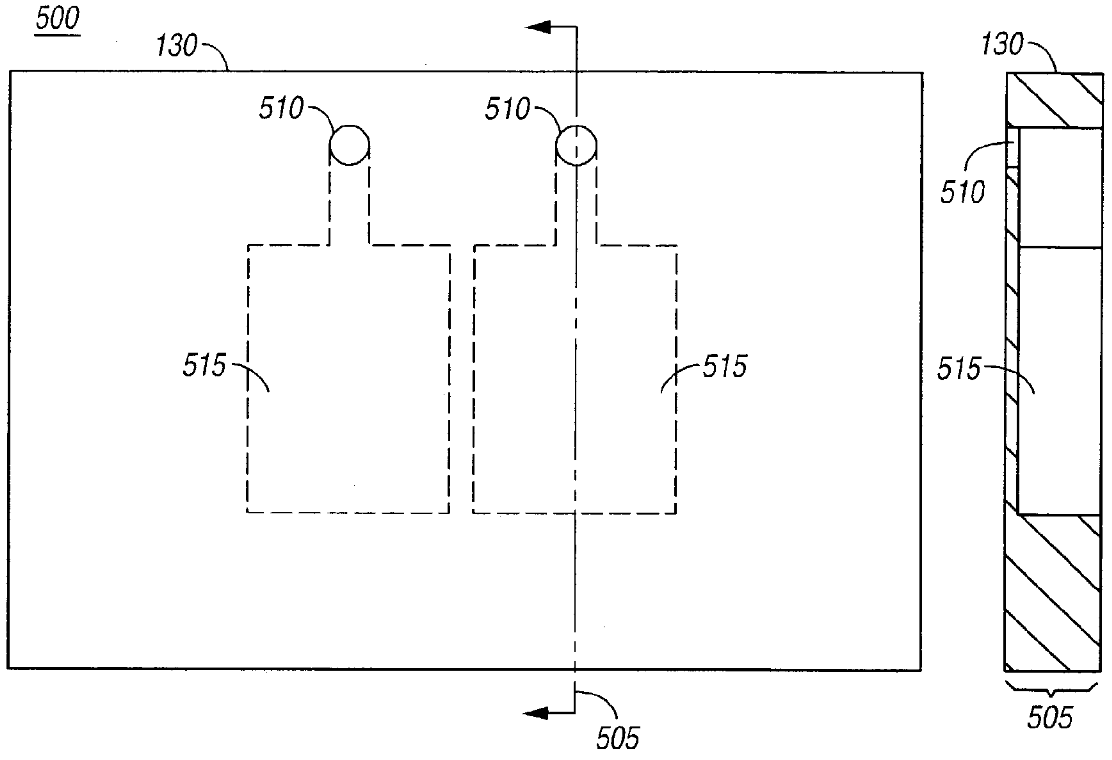
FIG. 5 is a top view of a membrane layer of a pusher mode liquid metal switch, according to certain embodiments of the present invention.

Referring now to FIG. 5 a top view 500 of the membrane layer 130 of the pusher mode liquid metal switch 105 is shown, according to certain embodiments of the present invention. The top view 500 illustrates an orientation of membrane layer 130 that includes a view of fluid flow restrictors 510. Fluid flow restrictors 510 are operable to control an amount of switching fluid 230 that flows into actuation fluid reservoir layer 120. Fluid flow restrictors 510 are sized so that adequate pressure is transferred to a liquid metal of plurality of liquid metals 235 while still providing a sufficient amount of switching fluid 230. A sectional view 505 illustrates an orientation of fluid flow restrictors 510 with respect to plurality of membranes 515.

Figure 6:
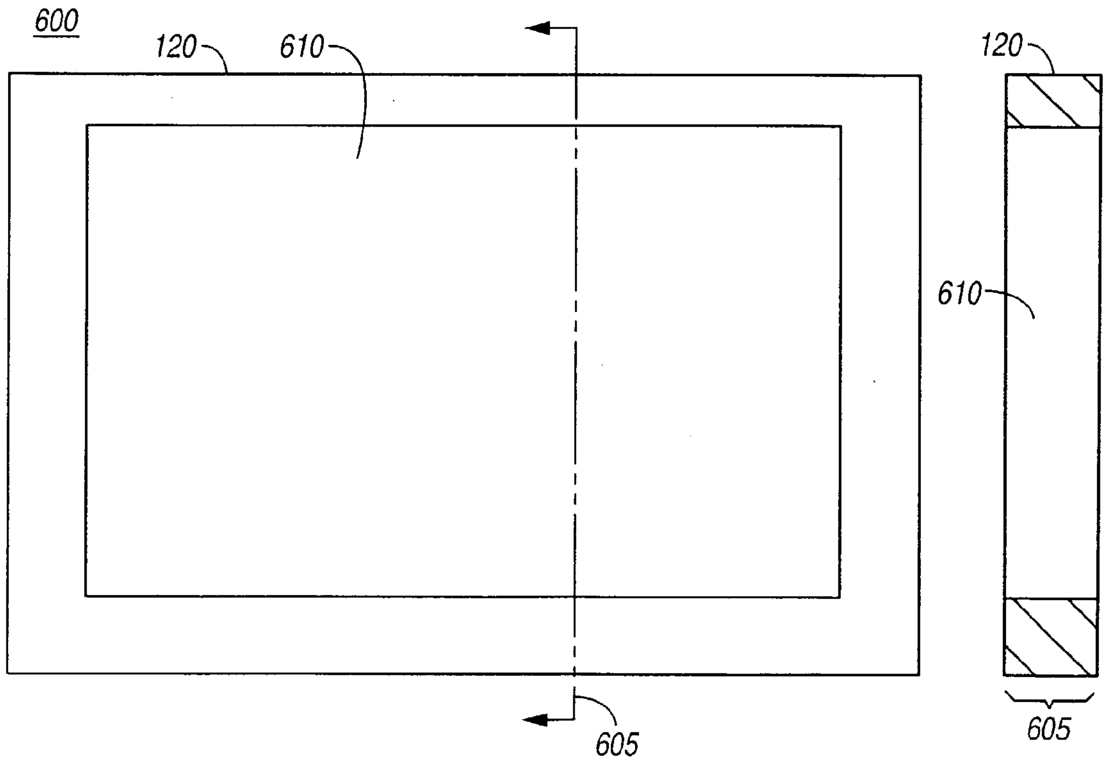
FIG. 6 is a top view of an actuator fluid reservoir layer of a pusher mode liquid metal switch, according to certain embodiments of the present invention.

Referring now to FIG. 6, a top view 600 of actuator fluid reservoir layer 120 of the pusher mode liquid metal switch 105 is shown, according to certain embodiments of the present invention. The top view 600 illustrates a size of a reservoir 610 containing actuating fluid 230. A sectional view 605 further illustrates a geometric shape of reservoir 610.

Figure 7:
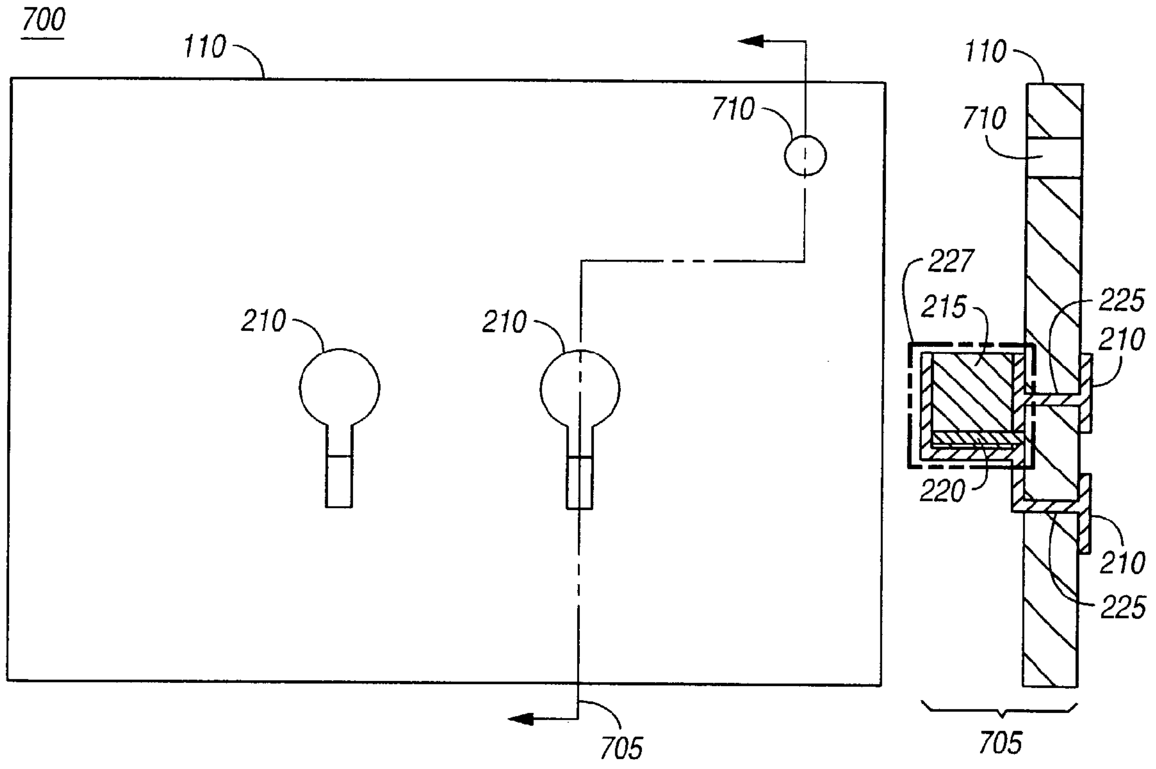
FIG. 7 is a bottom view of a piezoelectric substrate layer of a pusher mode liquid metal switch, according to certain embodiments of the present invention.

Referring now to FIG. 7 a bottom view 700 of piezoelectric substrate layer 110 of the pusher mode liquid metal switch 105 is shown, according to certain embodiments of the present invention. The bottom view 700 illustrates an orientation of plurality of actuators 227. Sectional view 705 further shows the orientation of a contact of the plurality of contacts 210. Also shown in FIG. 7 is fill port 710. Fill port 710 is operable to be used to fill reservoir 610 with actuating fluid 205. In certain embodiments of the present invention, actuating fluid 205 is filled during assembly of pusher mode liquid metal switch 105, after which fill port 710 is sealed.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A structure for an electrical switch, comprising:

a chamber housed within a solid material, said chamber filled with an actuator liquid;

a plurality of switch contacts within the chamber, wherein the plurality of switch contacts are coupled to the solid material;

a plurality of liquid metal globules, coupled to the plurality of switch contacts and coupled to the chamber; and a plurality of piezoelectric elements coupled to a plurality of membranes, said plurality of membranes coupled to the chamber, wherein the plurality of piezoelectric elements are within a reservoir, said reservoir containing actuating liquid.

2. The structure of claim 1, wherein the actuator liquid is inert and electrically non-conductive.

3. The structure of claim 1, wherein the actuating liquid is an inert, low viscosity, high boiling fluid.

4. The structure of claim 1, wherein the one or more liquid metal globules are composed of mercury.

5. The structure of claim 1, wherein the plurality of membranes are coupled to a corresponding plurality of orifices, wherein an orifice of the plurality of orifices is operable to increase a rate of flow of the actuating liquid.

6. The structure of claim 1, wherein the plurality of membranes have a corresponding plurality of widths, said corresponding plurality of widths being greater than an extent in a non-actuating direction of the plurality of piezoelectric elements.

7. The structure of claim 1, wherein the plurality of piezoelectric elements are further coupled to a corresponding plurality of contacts, said plurality of contacts operable to actuate the plurality of piezoelectric elements.

8. The structure of claim 7, wherein each contact of the plurality of contacts comprise a first terminal coupled to a first end of a piezoelectric element and a second terminal coupled to a second end of the piezoelectric element.

9. The structure of claim 8, wherein the first terminal and the second terminal are separated by a dielectric.

10. A structure for an electrical switch, comprising:

a piezoelectric substrate layer;

an actuator fluid reservoir layer coupled to the piezoelectric substrate layer, said actuator fluid reservoir layer further comprising one or more piezoelectrically actuated pusher elements;

a membrane layer coupled to the actuator fluid reservoir layer, said membrane layer comprising one or more membranes coupled to the one or more piezoelectrically actuated pusher elements;

a liquid metal channel layer coupled to the membrane layer;

a circuit substrate layer coupled to the liquid metal channel layer; and an actuator liquid-filled chamber housed within the liquid metal channel layer, wherein the actuator liquid-filled chamber comprises one or more globules of liquid metal coupled to one or more switch contacts, said actuator liquid-filled chamber coupled to the one or more membranes.

11. The structure of claim 10, wherein the actuator fluid reservoir layer, piezoelectric substrate layer, membrane layer, circuit substrate layer and liquid metal channel layer are comprised of one or more of glass, ceramic, composite material and ceramic-coated material.

12. The structure of claim 10, wherein the actuator fluid reservoir layer further comprises a fill port, said fill port operable to be used for filling a reservoir of the actuator fluid reservoir layer with actuator fluid.

13. The structure of claim 10, wherein the circuit substrate layer further comprises a plurality of circuit traces and a plurality of pads operable to route one or more signals generated by actuation of one or more of the plurality of piezoelectric elements.

14. The structure of claim 10, wherein the actuator liquid is inert and electrically non-conductive.

15. The structure of claim 10, wherein the one or more liquid metal globules are composed of mercury.

16. The structure of claim 10, wherein the plurality of piezoelectric elements are further coupled to a corresponding plurality of contacts, said plurality of contacts operable to actuate the plurality of piezoelectric elements.

17. The structure of claim 16, wherein each contact of the plurality of contacts comprise a first terminal coupled to a first end of a piezoelectric element and a second terminal coupled to a second end of the piezoelectric element.

18. The structure of claim 17, wherein the first terminal and the second terminal are separated by a dielectric.

19. The structure of claim 10, wherein the plurality of membranes are coupled to a corresponding plurality of orifices, wherein an orifice of the plurality of orifices is operable to increase a rate of flow of the actuating liquid.

20. The structure of claim 19, wherein the plurality of orifices are located in the liquid metal channel layer.

21. A method for electrical switching of one or more electrical signals using a liquid metal switch, comprising:

actuating a piezoelectric element;

deflecting a membrane element by the actuation of the piezoelectric element;

increasing a pressure of actuator liquid by the deflection of the membrane element;

the increase in pressure of the actuator liquid breaking a liquid metal connection between a first contact and a second contact of the liquid metal switch, wherein the liquid metal connection is maintained by a surface tension between a liquid metal and the first contact and the second contact; and after breaking the liquid metal connection establishing a second liquid metal connection between the second contact and a third contact, further comprising:

breaking the second liquid metal connection by application of a second electric potential with a polarity opposite the first electric potential, said second electric potential actuating the piezoelectric element so that a negative pressure is exerted on the membrane element thereby pulling the liquid metal to re-establish the liquid metal connection between the first contact and the second contact and break the second liquid metal connection between the third contact and the second contact.

22. The method of claim 21, wherein the piezoelectric element is actuated by an application of an electric potential applied to a first side and a second opposite side of the piezoelectric element.

23. The method of claim 21, wherein prior to an operation of the electrical switch, actuator fluid is added to the liquid metal switch using a fill port.

24. The method of claim 21, wherein an orifice is used to increase a flow rate of actuator liquid caused by the increase in pressure, said increased flow rate operable to more rapidly break the liquid metal connection.

25. The method of claim 21, further comprising breaking the second liquid metal connection by the use of a second piezoelectric element, a second membrane element, a second electric potential, whereby the second electric potential actuates the second piezoelectric element causing the second membrane element to deflect and increase the pressure of the actuator fluid, said actuator fluid then being operable to flow and break the second liquid metal connection.

* * * * *